United States Patent [19]

McDaniel et al.

[11] Patent Number: 4,584,560
[45] Date of Patent: Apr. 22, 1986

[54] FLOATING POINT DIGITIZER

[75] Inventors: James E. McDaniel, Sunnyvale; Kenneth R Smith, Milpitas, both of Calif.

[73] Assignee: Geometrics, Inc., Sunnyvale, Calif.

[21] Appl. No.: 618,985

[22] Filed: Jun. 11, 1984

[51] Int. Cl.⁴ ............................................. H03M 1/00
[52] U.S. Cl. ......................... 340/347 AD; 340/347 M
[58] Field of Search ............... 324/115; 340/347 AD, 340/347 M

[56] References Cited

U.S. PATENT DOCUMENTS

| | | | |
|---|---|---|---|
| 3,509,558 | 4/1970 | Cancro | 340/347 AD |
| 4,016,557 | 4/1977 | Zitelli et al. | 340/347 AD |
| 4,393,369 | 7/1983 | Davies | 340/347 AD |

Primary Examiner—Bernard Roskoski
Attorney, Agent, or Firm—Robert P. Cogan

[57] ABSTRACT

In a floating point digitizer, an analog signal is delivered to two signal paths. One includes a delay line. In the first path, the analog signal is measured in terms of order of magnitude to provide a signal indicative of an exponent. This same value is utilized to set the gain of a variable gain amplifier to which the delayed signal is applied and from which a mantissa is resolved.

7 Claims, 1 Drawing Figure

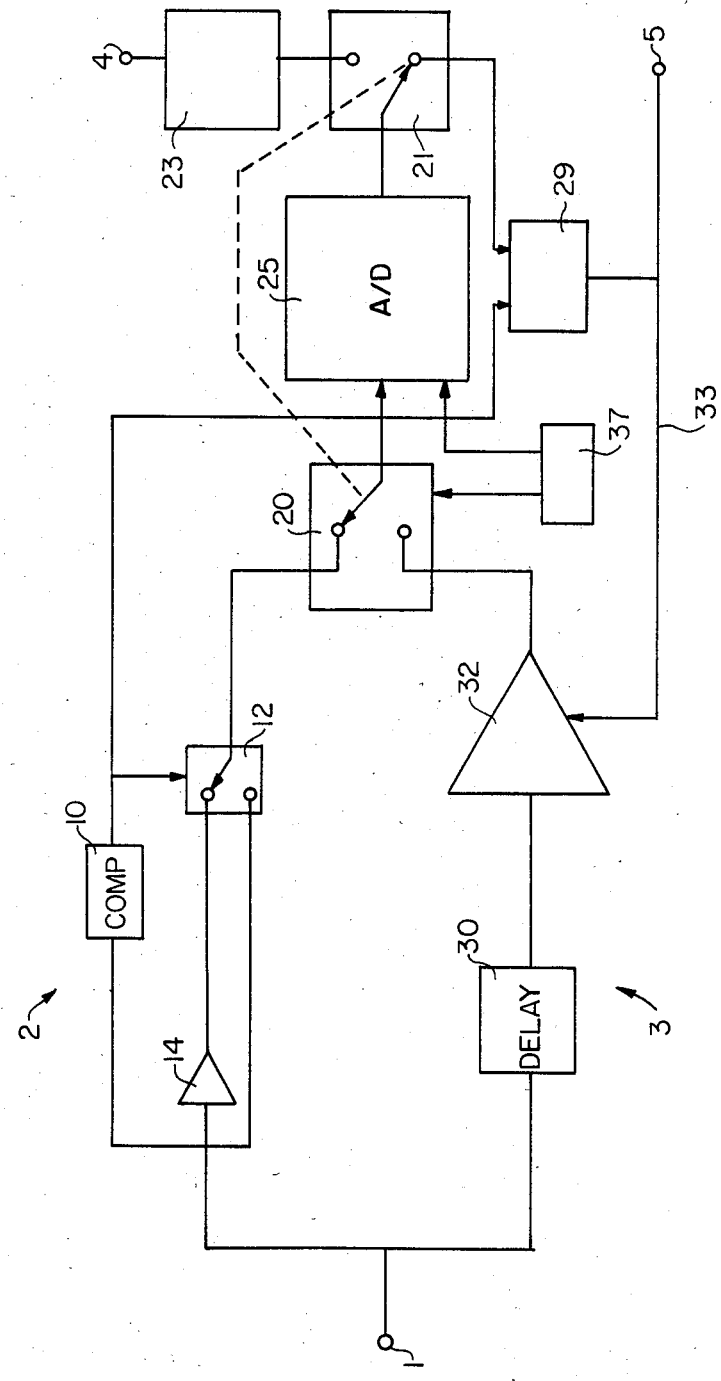

FLOATING POINT DIGITIZER

BACKGROUND OF THE INVENTION

The present invention relates to a floating point digitizer comprising a wide range gain ranging amplifier and means for providing digital outputs each indicative of an analog input.

Floating point amplifiers find application in such apparatus as means for collecting and representing seismic data, for example, reflection seismographs. In seismography, it may be equally significant to resolve to as many significant bits as possible, signals in the vicinity of the analog zero level as well as signals of much higher analog levels. In order to do this, a gain ranging amplifier is used coupled to an analog-to-digital converter. Thus when a signal is low, the gain of the amplifier is increased. When the analog signal is relatively high, the gain of the amplifier is decreased. The objective is to apply analog input voltages to the analog-to-digital converter in the upper half of its dynamic range at all times so as to maximize resolution provided by the analog-to-digital converter. Change in gain can be accommodated for by using a scale factor related to the gain.

In order to handle maximum amounts of data it is desirable to increase the speed at which the gain ranging amplifier will operate and operate reliably. "Reliably" refers to maintaining the analog input to the analog-to-digital converter in the upper half of its analog dynamic range. Many prior art arrangements have been provided but have different shortcomings with respect to the goals of the present invention. One example is the circuit disclosed in U.S. Pat. No. 4,031,504, issued June 21, 1977. In the circuit illustrated therein, a gain ranging amplifier comprises a plurality of high-gain amplifiers connected in cascade between an input terminal and an output terminal. Each amplifier has a low-gain state and can be switched by a controller to a high-gain state. Voltage reference means selectively provide a discreet reference voltage to correspond with each amplifier. A comparator makes a comparison between the system's output voltage and the selected reference voltage. If the comparison shows that the reference voltage is greater than the output voltage, the controller adjusts the first amplifier to its high gain. Further comparisons are made for successive stages. This circuit provides speed limitations in that it will take a finite time for the successive by gain amplifier stages to settle to their amplifying states. Further, the nature of the input could change by the time the gains are set.

Another example is seen in U.S. Pat. No. 3,684,968, issued Aug. 15, 1972. Again, the output of a floating point amplifier is sensed and the parameters of an input signal are compared to cause a digital gain increase or gain decrease to the floating point amplifier. In both of these circuits, as well as other prior art circuits, there is an inherent speed limitation due to the time to set the gain amplifiers up for a currently incoming signal. Further, by the time that the amplifiers are set, the nature of the input could change. These and other prior art circuits either predict or assume or estimate where the amplitude of the incoming signal will be at some time later than the time at which the gain of the amplifier is set. Such predictions, assumptions, or estimations may be wrong. Such operation leads to provision of less than maximized resolution. Alternatively, clipping could result, and the signal would be converted inaccurately.

SUMMARY OF THE INVENTION

It is therefore an object of the present invention to provide a floating point amplifier in which gain of the gain ranging amplifier incorporated therein is set on the basis of the level of the signal currently being processed rather than on the basis of a signal occurring earlier in time.

It is also an object of the present invention to provide a means for providing a floating point digital signal based on an analog input in which the same analog-to-digital converter may be utilized to provide the output signal and to provide the gain setting signal for a gain ranging amplifier.

It is also an object of the present invention to provide a method of the type described for providing a floating point signal.

Briefly stated in accordance with the present invention, in a floating point digitizer, an analog signal is delivered to two signal paths. One includes a delay line. In the first path, the analog signal is measured in terms of order of magnitude to provide a signal indicative of an exponent. This same value is utilized to set the gain of a variable gain amplifier to which the delayed signal is applied and from which a mantissa is resolved. The same analog-to-digital converter may provide the exponent output, the mantissa output and the gain setting signal.

DESCRIPTION OF THE DRAWING

The means by which the foregoing objects and features of the invention are achieved are pointed out with particularity in the claims forming the concluding portion of the specification. The invention, both as to its organization and manner of operation may be further understood by reference to the following description taken in connection with the following drawing.

The FIGURE is a block diagrammatic representation of a floating point digitizer constructed in accordance with the present invention.

DESCRIPTION OF THE PREFERRED EMBODIMENT

Referring now to the FIGURE, a floating point digitizer constructed in accordance with the present invention is illustrated block diagrammatic form. An analog signal from a prior art source is delivered to an input terminal 1. The prior art source may include a multiplex output coupling an analog input indicative of a response over any one of a number of seismographic channels. The input terminal 1 is coupled to a first signal path 2 coupling an undelayed signal, and a second signal path 3 coupling a delayed signal for provision of a digital output having a first multiple bit output indicative of exponent at an output terminal 5 and a digital output indicative of mantissa at an output terminal 4.

In the non-delayed signal path 2 the input signal is coupled from the terminal 1 to a comparator 10 which is utilized to provide an extra bit of resolution on the gross magnitude of the analog-to-digital converter described below. The output of the comparator 10 controls a switching means 12 having connected thereto terminal 1 at one input and the output of an amplifier 14 at its other input. The comparator 10 compares the input signal to reference level supplied thereto from a source 15. The amplifier 14 receives an input from the terminal 1. In the preferred embodiment, a signal range is provided which is greater than the resolution of currently available analog to digital converters. Therefore, when the input signal is too small for accurate resolution, i.e. when below a level to which the reference level is selected to correspond, the gain of the amplifier 14 is utilized to provide an analog signal which is of a level which may be resolved accurately. If the input signal is over the reference level, the switching means 12 is operated to the lower position illustrated in FIG. 1 to connect the terminal 1 directly to a switching means 20. If the input signal is below the reference level, the output of the amplifier 14 is connected to the switching means 20, and the comparator 10 provides an output further described below to indicate the corresponding change in the exponent used to represent the value of the input signal.

The switching means 20 has an output connected to the analog-to-digital converter 25 providing an output to a switching means 21. The switching means 21 is operable in synchronism with the switching means 20 first to provide an output to an exponent register 29 and next to a mantissa register 29. The mantissa terminal 4 is actually representative of a bus at the output of the mantissa register 29. Similarly, the exponent terminal 5 represents a bus at the output of the exponent register 29.

In the delayed signal path 3 the input terminal 1 is connected to a delay line 30 providing an undistorted and delayed form of the input signal to a gain ranging amplifier 32 having an output connected to the switching means 20. A suitable delay line 30 is one which does not distort any desired input signal. The delay time period of the delay line 30 is selected to be the minimum time necessary to allow for stabilization of the variable gain amplifier 32 and operated as described below. The output of the exponent register 29 is also connected to the setting input of the variable gain amplifier 32 via a bus 33. The register circuit 29 receives an additional input from the comparator 10. The analog-to-digital converter 25 and switching means 20 are operated in response to timing control logic 37 connected thereto.

In a first half cycle, the undelayed signal path 2 has its output connected by the switching means 20 to the analog-to-digital converter 25. The digital output therefrom is connected by the switching means 21 to the register 29, which may also be viewed as a decoder. The sample analog input voltage is compared successively to analog levels representing successive digital significant digits of the exponent and a digital representation of the analog input is produced for registering in the register 29 and coupling to the bus 33. The output of the comparator 10 is combined with the exponent value in the register 29 to represent the power of the multiplication provided by the amplifier 14.

The number in the register 29 comprises the exponent output at the terminal 5, indicates an order of magnitude and sets the gain of amplifier 32. After a time equal to the delay in the delay means 30, which is selected to include the settling time of the amplifier 32, the analog-to-digital converter 25 is connected by the switching means 20 to provide analog-to-digital conversion of the signal provided through the delayed signal path 3. The output of the analog-to-digital converter 25 is connected by switching means 21 to the mantissa register 23. After capture and conversion of the analog-to-digital converter 25 the output at the terminals 4 and 5 is a binary floating point number whose exponent is the value of gain. The mantissa is the digital representation of the amplified signal.

The present invention eliminates the need to determine rates of change of the input in order to predict the next gain change needed to maximize resolution of the floating point digitizer. It also prevents the need to successively add, subtract or set combinations of fixed and variable gain stages between samples based on information gained from sensing an input or output signal and comparing it against a fixed reference before each new gain change is made. Each signal is amplified based on its own level.

What is claimed as new and desired to be secured by Letters Patent of the United States is:

1. In an analog digitizer comprising input means for receiving an analog signal, a variable gain amplifier and analog-to-digital conversion means for converting the output of said variable gain amplifier, and delay means coupled between said input means and said variable gain amplifier, the improvement comprising means for providing an order of magnitude indicating signal, switching means for connecting said indicating signal to said analog-to-digital conversion means to produce a digitized indicating signal, switching means having a switching period selected in accordance with the delay provided by said delay means for applying said digitized indicating signal to said variable gain amplifier as a function of the magnitude of the analog signal, said variable gain amplifier being set to provide a current gain value to the analog signal in response to the digitized indicating signal and switching means connected to the output of said variable gain amplifier and defining a second half cycle in which the output of said variable gain amplifier is provided to said analog-to-digital conversion means for producing a value indicative of the mantissa of the analog value.

2. The improvement according to claim 1 further comprising decoder means coupled between the output of said analog-to-digital conversion means and said variable gain amplifier.

3. The improvement according to claim 2 further comprising switching means and comparison means coupling the analog input for evaluating the order of magnitude thereof during a next half cycle while said analog-to-digital conversion means is producing said value indicative of the mantissa of a current half cycle.

4. A floating point digitizer comprising a first, undelayed signal path, a second, delayed signal path, said delayed signal path comprising a variable gain amplifier, analog-to-digital conversion means for generating an exponent signal indicative of the order of magnitude of a current analog input signal, switching means for defining first and second half-cycles and for connecting said exponent signal to said analog-to-digital conversion means during a first half cycle and providing a digital output indicative thereof for setting said variable gain amplifier, said switching means establishing a second half cycle and connecting the current delayed analog signal to said variable gain amplifier means and connecting the output thereof during said second half cycle to said analog-to-digital conversion means.

5. The improvement according to claim 4 further comprising switching means and comparison means coupling the analog input for evaluating the order of magnitude thereof during a next half cycle while said analog-to-digital conversion means is producing said value indicative of the mantissa of a current half cycle.

6. A method for floating point digitization of an analog input signal comprising dividing such signal into first and second delayed and undelayed paths, deriving an order of magnitude signal and digitizing said order of magnitude signal during a first half cycle indicative of the order magnitude of a current analog signal, applying the signal indicative of the value of said exponent to set the gain of said variable gain amplifier during a second half cycle and supplying the current delayed analog signal to said amplifier for conversion by said analog-to-digital conversion means to provide a mantissa signal for the current analog signal.

7. The method of claim 6 further comprising the step of evaluating the magnitude of a next current analog signal during conversion of a current delayed analog signal.

* * * * *